US010374106B2

(12) United States Patent
Jacob

(10) Patent No.: US 10,374,106 B2
(45) Date of Patent: Aug. 6, 2019

(54) INTEGRATED GRAPHENE DETECTORS WITH WAVEGUIDES

(71) Applicant: GLOBALFOUNDRIES INC., Grand Cayman (KY)

(72) Inventor: Ajey P. Jacob, Watervliet, NY (US)

(73) Assignee: GLOBALFOUNDARIES INC., Grand Cayman (KY)

( * ) Notice: Subject to any disclaimer, the term of this patent is extended or adjusted under 35 U.S.C. 154(b) by 0 days.

(21) Appl. No.: 15/486,849

(22) Filed: Apr. 13, 2017

(65) Prior Publication Data

US 2018/0301569 A1 Oct. 18, 2018

(51) Int. Cl.
| | |
|---|---|
| *G02B 6/12* | (2006.01) |
| *H01L 31/18* | (2006.01) |
| *H01L 27/144* | (2006.01) |
| *H01L 31/105* | (2006.01) |
| *H01L 31/0232* | (2014.01) |
| *H01L 31/0352* | (2006.01) |
| *H01L 31/0392* | (2006.01) |

(52) U.S. Cl.
CPC .... *H01L 31/02327* (2013.01); *G02B 6/12004* (2013.01); *H01L 27/144* (2013.01); *H01L 27/1446* (2013.01); *H01L 31/03529* (2013.01); *H01L 31/03921* (2013.01); *H01L 31/105* (2013.01); *H01L 31/1804* (2013.01); *G02B 2006/12061* (2013.01); *G02B 2006/12097* (2013.01); *G02B 2006/12123* (2013.01)

(58) Field of Classification Search
CPC .................. H01L 29/16–1608; H01L 29/6603
See application file for complete search history.

(56) References Cited

U.S. PATENT DOCUMENTS

| | | | |
|---|---|---|---|
| 7,732,859 B2 * | 6/2010 | Anderson | H01L 29/1606 257/328 |
| 8,507,893 B2 | 8/2013 | Okai | |
| 8,633,055 B2 * | 1/2014 | Adkisson | H01L 29/66045 257/E21.001 |
| 8,648,342 B2 | 2/2014 | Kim et al. | |
| 8,987,740 B2 | 3/2015 | Avouris et al. | |
| 9,171,907 B2 * | 10/2015 | de Heer | H01L 29/66431 |
| 2011/0315988 A1 * | 12/2011 | Yu | H01L 27/14 257/52 |
| 2013/0105795 A1 * | 5/2013 | Kim | H01L 31/028 257/49 |
| 2014/0015015 A1 | 1/2014 | Krivokapic et al. | |

(Continued)

OTHER PUBLICATIONS

Liu et al., "Graphene benefits", Nature Photonics, Sep. 15, 2013, 2 pages.

(Continued)

*Primary Examiner* — Charles D Garber
*Assistant Examiner* — Alia Sabur
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to graphene detectors integrated with optical waveguide structures and methods of manufacture. The structure includes a plurality of non-planar fin structures composed of substrate material, and a non-planar sheet of graphene material extending entirely over each of the plurality of non-planar fin structures.

15 Claims, 7 Drawing Sheets

(56) References Cited

U.S. PATENT DOCUMENTS

| | | | |
|---|---|---|---|
| 2014/0272309 A1* | 9/2014 | Davis | H01L 29/41 |
| | | | 428/161 |
| 2015/0303299 A1 | 10/2015 | Chang et al. | |
| 2016/0013184 A1 | 1/2016 | Alptekin et al. | |
| 2017/0243791 A1 | 8/2017 | Jacob | |

OTHER PUBLICATIONS

Mueller et al., "Graphene photodetectors for high-speed optical communications", Nature Photonics, Mar. 28, 2010, DOI: 10.1038, NPHOTON.2010.40, 5 pages.
Taiwanese Office Action and Search Report for related TW Application No. 106125511, dated Mar. 5, 2018, 9 pages.
Kim et al., "A role for graphene in silicon-based semiconductor devices", Nature, vol. 479, Nov. 17, 2011, pp. 338-344.
Li et al., "Optical absorption in graphene integrated on silicon waveguides", Applied Physics Letters 101(11), Sep. 2012, 14 pages.
Kim et al., "Graphene-based photonic devices for soft hybrid optoelectronic systems", 2012 IOP Publishing Ltd, Nanotechnology, vol. 23, No. 34, Aug. 10, 2012, 2 pages, Abstract only.
Taiwanese Notice of Allowance for related TW Application No. 106125511, dated Jun. 13, 2018, 4 pages.

* cited by examiner

INTEGRATED GRAPHENE DETECTORS WITH WAVEGUIDES

FIELD OF THE INVENTION

The present disclosure relates to semiconductor structures and, more particularly, to graphene detectors integrated with optical waveguide structures and methods of manufacture.

BACKGROUND

Silicon photonics is the application of photonic systems which use silicon as an optical medium. The silicon is usually patterned with sub-micrometer precision, into microphotonic components. Silicon photonic devices can be made using existing semiconductor fabrication techniques, and because silicon is already used as the substrate for most integrated circuits, it is possible to create hybrid devices in which the optical and electronic components are integrated onto a single microchip. Silicon photonics include silicon waveguides which, due to their unique guiding properties, can be used for communications, interconnects, biosensors, etc.

Monolithic integration of silicon photonics is required for next generation terrabit communications and highly integrated, dense structures. Currently, the interconnects in such structures are copper. However, copper is at inflexion point in that moving to higher gigabyte performance, e.g., 25 gigabytes and above, involves additional costs and power consumption. This creates demand for silicon photonics technology to transfer data.

SUMMARY

In an aspect of the disclosure, a structure comprises: a plurality of non-planar fin structures composed of substrate material; and a non-planar sheet of graphene material extending entirely over each of the plurality of non-planar fin structures.

In an aspect of the disclosure, a method comprises: forming a plurality of non-planar waveguide fin structures from substrate material; forming material on the non-planar waveguide fin structures; and thermally decomposing the material to form a non-planar sheet of graphene material extending over each of the plurality of non-planar waveguide fin structures In an aspect of the disclosure, a method comprises: forming a plurality of non-planar fin structures from semiconductor on insulator material; depositing carbon based material on the non-planar fin structures; annealing the carbon based material to thermally decompose the carbon based material into a non-planar sheet of stressed graphene material extending over an entirety of each of the plurality of non-planar fin structures; and forming contacts in electrical connection to the non-planar sheet of graphene material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to graphene detectors integrated with optical waveguide structures and methods of manufacture. More specifically, the present disclosure is directed to monolithic integration of graphene detectors with non-planar silicon waveguide structures. By utilizing such a design, advantageously, the monolithic integration of silicon photonics can be used for next generation terrabit communications and other dense System on Chip (SoC) applications.

In embodiments, the graphene detectors are non-planar sheets of graphene material deposited on non-planar waveguide structures. In more specific embodiments, the non-planar silicon waveguide structures are composed of silicon-based fin structures formed from silicon on insulator (SOI) substrates. The graphene sheets can be formed by a thermal decomposition process over the non-planar fin structures, which results in non-planar sheets of graphene. By implementing the non-planar designs described herein, the density of graphene on a given footprint can be increased thus increasing the efficiency of graphene based applications, e.g., increasing the detection efficiency, as well as help to scale the waveguide structures. Moreover, it should be understood that the non-planarity of the graphene sheets introduces a stress into the material thereby enabling utilization of its full bandgap range (e.g., 1.3-2.75 μm).

The integrated graphene detectors with waveguide structures of the present disclosure can be manufactured in a number of ways using a number of different tools. In general, though, the methodologies and tools are used to form structures with dimensions in the micrometer and nanometer scale. The methodologies, i.e., technologies, employed to manufacture the integrated graphene detectors with waveguide structures of the present disclosure have been adopted from integrated circuit (IC) technology. For example, the integrated graphene detectors with waveguide structures are built on wafers and are realized in films of material patterned by photolithographic processes on the top of a wafer. In particular, the fabrication of the integrated graphene detectors with waveguide structures uses three basic building blocks: (i) deposition of thin films of material on a substrate, (ii) applying a patterned mask on top of the films by photolithographic imaging, and (iii) etching the films selectively to the mask.

Figure 1A:
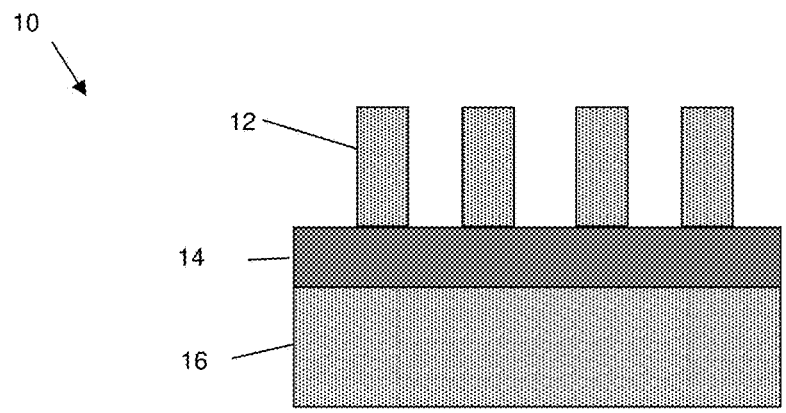
FIGS. 1A-1C show respective structures and fabrication processes in accordance with aspects of the present disclosure.
Figure 1B:
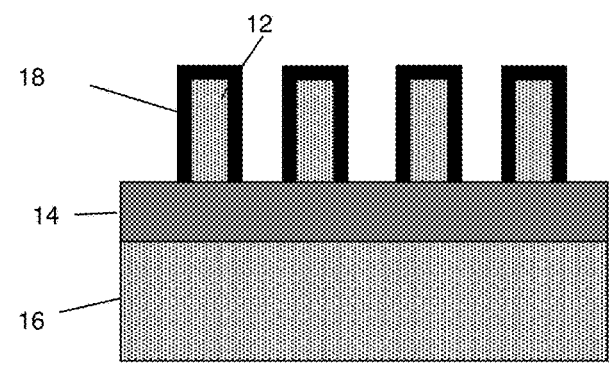
Figure 1C:
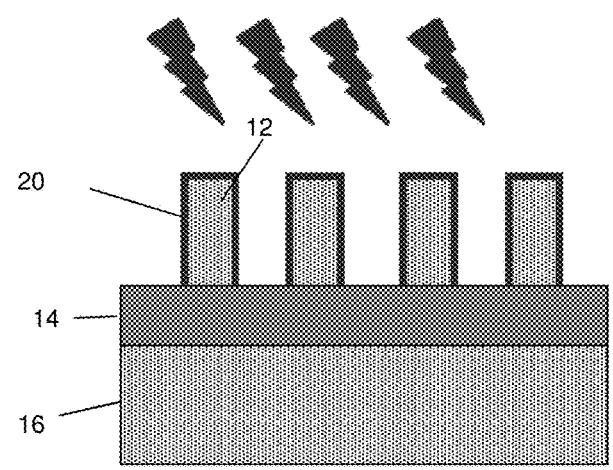

FIGS. 1A-1C show respective structures and fabrication processes in accordance with aspects of the present disclosure. More specifically, the structure 10 of FIG. 1A shows a plurality of fin structures 12 formed from a substrate material, e.g., preferably a silicon-on-insulator (SOI) substrate composed of underlying semiconductor material 16 and a buried oxide layer 14. In embodiments, the fin structures 12 can be composed of any suitable waveguide material including, but not limited to, Si, SiGe, SiGeC, SiC, GaAs, InAs, InP, and other III/V or II/VI compound semiconductors. As should be understood by those of skill in the art, the fin structures 12 can be waveguide structures.

In embodiments, the fin structures 12 can be ultra-large height-to-width ratio fin structures (e.g., high aspect ratio fin structures for 22 nm and smaller technology nodes) formed by conventional CMOS processes. For example, the fin structures 12 can be about 10 nm wide (although other dimensions are contemplated herein) formed by a sidewall image transfer (SIT) process.

In the SIT technique, for example, a mandrel material, e.g., $SiO_2$, is formed on an upper surface of the substrate using conventional CVD processes. A resist is formed on the mandrel material, and exposed to light to form a pattern (openings). A reactive ion etching is performed through the openings to form the mandrels. In embodiments, the mandrels can have different widths and/or spacing depending on the desired dimensions between the fin structures 12. Spacers are formed on the sidewalls of the mandrels which are preferably material that is different than the mandrels, and which are formed using conventional deposition processes known to those of skill in the art. The spacers can have a width which matches the dimensions of the fin structures 12, for example. The mandrels are removed or stripped using a conventional etching process, selective to the mandrel material. An etching is then performed within the spacing of the spacers to form the sub-lithographic features. The sidewall spacers can then be stripped. In embodiments, the fin structures 12 can also be formed during this or other patterning processes, or through other conventional patterning processes, as contemplated by the present disclosure.

In FIG. 1B, a material 18 is selectively deposited on the fin structures 12, i.e., over an entirety of the fin structures including a top surface and sidewalls of the fin structures 12. In embodiments, the material 18 is SiC material selectively deposited on portions (an end portion) of the fin structures 12. The SiC material can be deposited on the fin structures 12 using an epitaxial growth process, e.g., chemical vapor deposition (CVD) process.

As shown in FIG. 1C, the SiC material 18 undergoes an anneal process to thermally decompose the SiC into non-planar graphene sheets 20 located over an entirety of the fin structures 12, e.g., a top surface and sidewalls of the fin structure 12. In accordance with aspects of the present disclosure, the non-planarity of the graphene sheets 20 results in a stress being introduced at edges of the graphene sheet 20 which, in turn, generates a full bandgap range, e.g., 1.3-2.75 µm. This bandgap range helps to improve the detector characteristics by quantizing states to amplify the signals.

The thermal decomposition process can be performed, e.g., by e-beam heating, resistive heating, etc., in a vacuum environment to form a monolayer sheet of graphene, e.g., 1 nm thick; although other relatively thick layers of graphene on the order of 4 layers or more are also contemplated herein. In embodiments, the anneal process can be a spike anneal process and, more specifically, can be performed at a temperature of about 900° C. to about 1100° C. at a pressure of about 1 ATM or above, e.g., in a range from about 1E-9 to about 1E-8 Torr. In more specific embodiments, the anneal process can be performed in an argon atmosphere at, e.g., 5 minutes at 1000° C.; 5 minutes at 1100° C.; and 10 minutes at 1250° C.

Figure 2A:
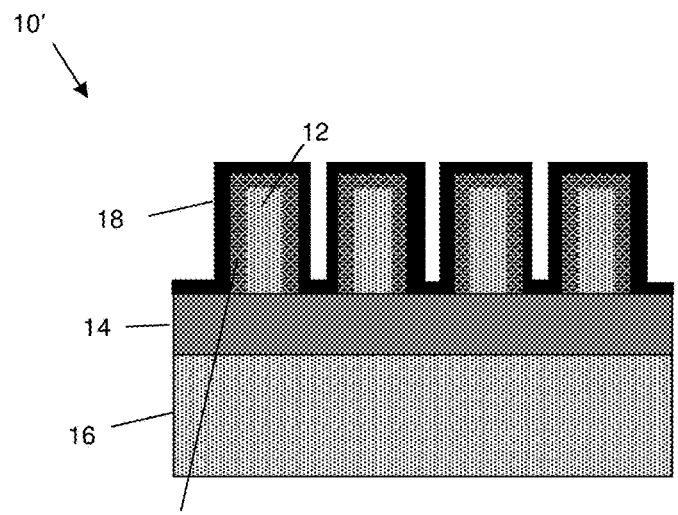
FIGS. 2A-2C show respective structures and fabrication processes in accordance with additional aspects of the present disclosure.
Figure 2B:
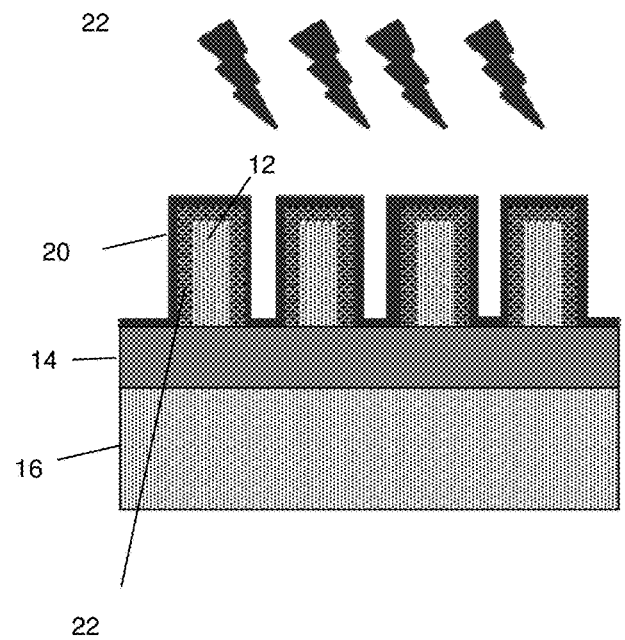
Figure 2C:
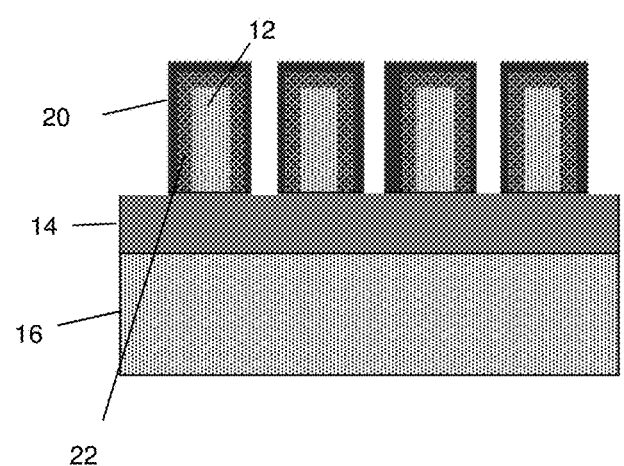

FIGS. 2A-2C show respective structures and fabrication processes in accordance with additional aspects of the present disclosure. More specifically, FIG. 2A shows a structure 10' comprising a plurality of fin structures 12 formed from a substrate, e.g., preferably a silicon on insulator (SOI) substrate composed of the semiconductor material 16 and buried oxide layer 14. As in any of the embodiments described herein, the fin structures 12 can be non-planar waveguide structures composed of any suitable material including, but not limited to, Si, SiGe, SiGeC, SiC, GaAs, InAs, InP, and other III/V or II/VI compound semiconductors. An insulator material 22, e.g., $SiO_x$, is deposited on the fin structures 12 using a conventional deposition process, e.g., CVD. A material 18, e.g., SiC, is blanket deposited on the insulator material 22.

As shown in FIG. 2B, the material 18 undergoes an anneal process to thermally decompose the SiC into graphene sheets 20. The graphene sheet 20 is provided on the entirety of the fin structures including, e.g., sidewalls and top surface of the fin structures 20, thereby imparting a stress on the graphene sheet 20 at edges thereof. As previously described, the thermal decomposition process can be performed, e.g., by e-beam heating, resistive heating, etc., to form a monolayer or multilayer sheet of graphene. By way of example, in embodiments, the anneal process can a spike anneal process and, more specifically, performed at a temperature of about 900° C. to about 1100° C. at a pressure of about 1 ATM or above as described herein. In more specific embodiments, the anneal process can be, e.g., 5 minutes at 1000° C.; 5 minutes at 1100° C.; and 10 minutes at 1250° C. And, as previously described, the stress introduced onto the non-planar graphene sheets 20 allow utilization of a large bandgap range, e.g., 1.3-2.75 µm.

FIG. 2C shows an optional step of removing graphene formed between the fin structures 12, e.g., on oxide material 14 of the SOI substrate, after the thermal decomposition process. For example, any graphene 20 formed on the oxide material 14 can be removed by a conventional anisotropic etching process, which will leave non-planar graphene sheets 20 on the fin structures 12, e.g., waveguide structures. In embodiments, the graphene sheet 20 can also remain on the oxide material 14 thereby forming a wraparound structure.

Figure 3A:
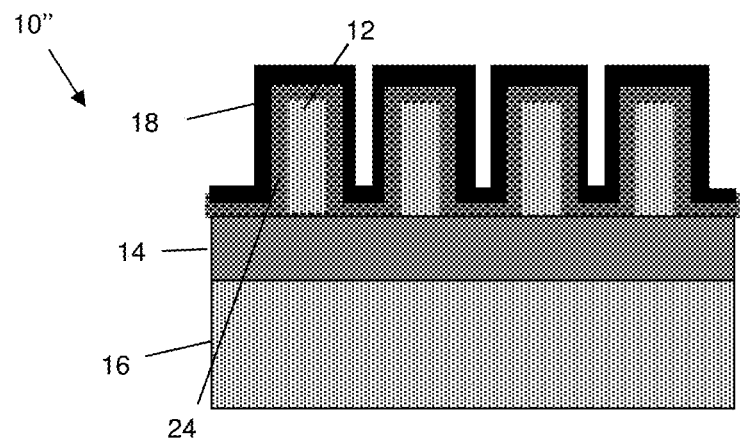
FIGS. 3A-3C show respective structures and fabrication processes in accordance with additional aspects of the present disclosure.
Figure 3B:
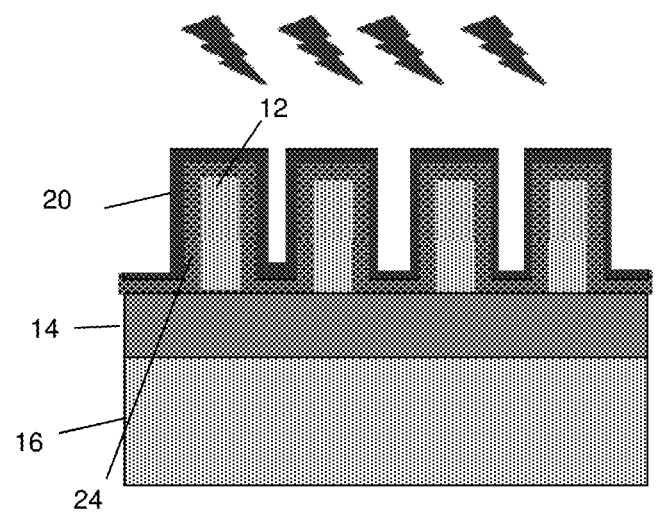
Figure 3C:
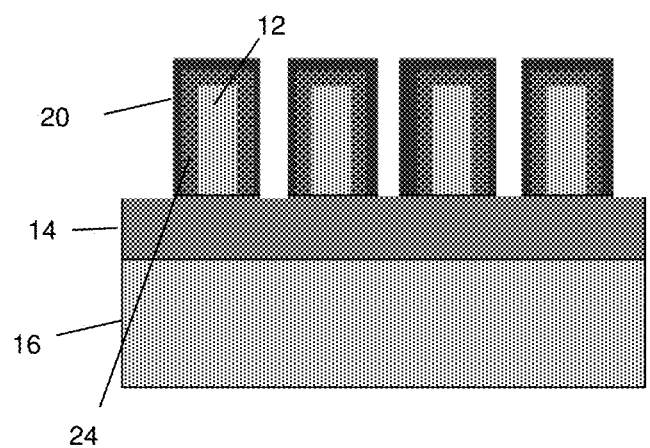

FIGS. 3A-3C show respective structures and fabrication processes in accordance with additional aspects of the present disclosure. More specifically, in FIG. 3A the structure 10" includes a layer of material 24 blanket deposited on the fin structures 12 and other exposed regions of the device, e.g., buried oxide layer 14. In embodiments, the layer of material 24 will have a crystalline structure similar to graphene, e.g., boron nitride. The material 24 can be deposited to a thickness of about 2 to 3 microns using a conventional deposition process, e.g., atomic layer deposition (ALD). A material 18, e.g., SiC, is blanket deposited on the layer of material 24.

As shown in FIG. 3B, the material 18 undergoes an anneal process to thermally decompose the SiC into non-planar graphene sheets 20. As previously described, graphene sheet 20 over an entirety of the fin structures 12 including the sidewalls and top surface of the fin structures 20, thereby imparting a stress on the graphene sheet 20 at edges thereof. That is, the stress introduced onto the non-planar graphene sheets 20 allow utilization of a large bandgap range, e.g., 1.3-2.75 μm. Also, the thermal decomposition process can be performed, e.g., by e-beam heating, resistive heating, etc., to form a monolayer or multilayer sheet of graphene. By way of example, in embodiments, the anneal process can a spike anneal process and, more specifically, performed at a temperature of about 900° C. to about 1100° C. at a pressure of about 1 ATM or above as described herein. In more specific embodiments, the anneal process can be, e.g., 5 minutes at 1000° C.; 5 minutes at 1100° C.; and 10 minutes at 1250° C.

In FIG. 3C, any graphene and other residual material on the substrate, e.g., oxide material 14 of the SOI substrate, can optionally be removed by a conventional anisotropic etching process selective to the materials 20, 24, using a masking process. In embodiments, the anisotropic etching process will leave non-planar graphene sheets 20 on the fin structures 12, e.g., waveguide structures. In embodiments, the graphene sheet 20 can remain on the oxide material 14 thereby forming a wraparound structure.

Figure 4A:
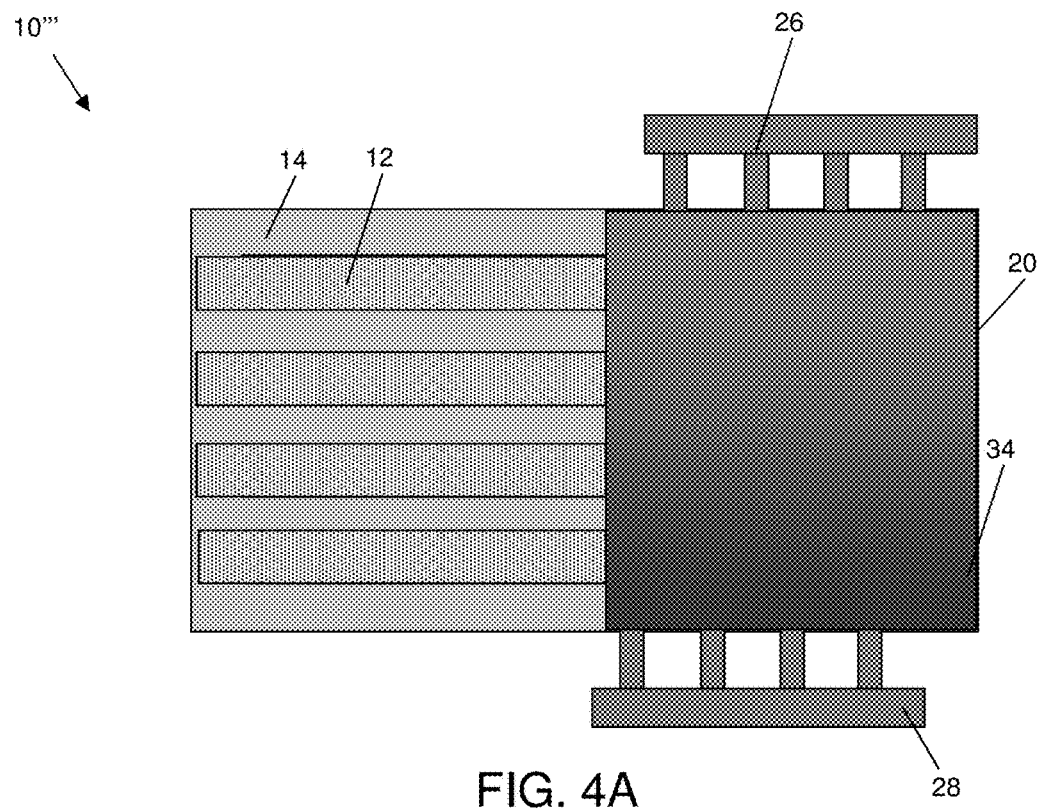
FIGS. 4A and 4B show an integrated graphene detector and waveguide structure and respective fabrication processes in accordance with additional aspects of the invention.
Figure 4B:
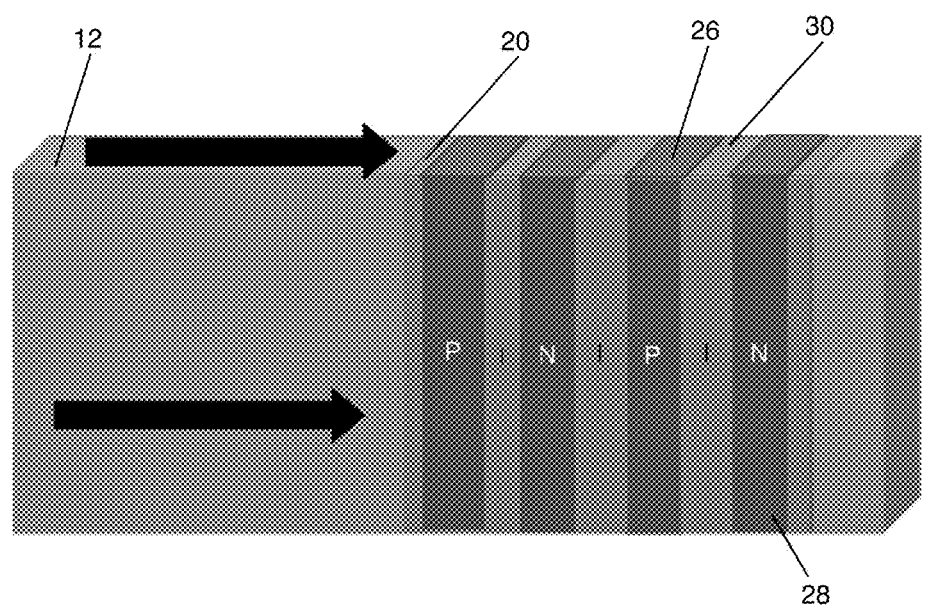

FIGS. 4A and 4B show an integrated graphene detector and waveguide structure and respective fabrication processes in accordance with aspects of the invention. More specifically, FIG. 4A shows a top view of an integrated graphene detector and waveguide structure 10'''; whereas, FIG. 4B shows a partial cut-away view of the integrated graphene detector and waveguide structure 10'''. In the embodiment of FIGS. 4A and 4B, the structure 10''' can be a PIN (P+, intrinsic, N+) detector with repetitive fin structures 12 being a back gate.

More specifically and referring to FIGS. 4A and 4B, the integrated graphene detector and waveguide structure 10''' includes a plurality of fin structures 12 formed on an insulator layer 14, e.g., buried oxide layer. A graphene sheet 20 is formed over an end portion, e.g., light exit area of the waveguide, of the fin structures 12, e.g., on the sidewalls and top surface of the fin structures 20 and extending onto the buried oxide layer 14. As noted already herein, the graphene sheet 20 which forms the integrated detector can be formed in many different ways including: (i) directly on the fin structures 12 (FIGS. 1A-1C), (ii) directly on insulator material (FIGS. 2A-2C), or (iii) directly on material with a crystalline structure similar to graphene (FIGS. 3A-3C). In additional embodiments, the graphene sheet 20 can be a wraparound structure, e.g., provided over and extending between the fin structures 12.

In any of these embodiments, the fin structures 12 can be surrounded by an insulator material 34, e.g., oxide based material. A plurality of metal contacts 26, 28 comprising finger electrodes are formed in direct electrical contact with the graphene sheet 20 over an uppermost top surface of the fin structures 12 (and, in embodiments, between the fin structures 12). In embodiments, the contacts 26, 28 are interlaced contacts located orthogonal to the fin structures 12. The contacts 26, 28 can be N+ doped and P+ doped contacts, respectively, formed by conventional lithography, etching and deposition processes known to those of skill in the art such that no further explanation is required. In embodiments, the N+ doped contact 26 is doped with phosphorous or arsenic and the P+ contact 28 is doped with boron, by ion implantation processes or diffusion processes. Portions between the metal contacts 26, 28 are intrinsic regions 30 formed from the graphene sheet 20.

Figure 5:
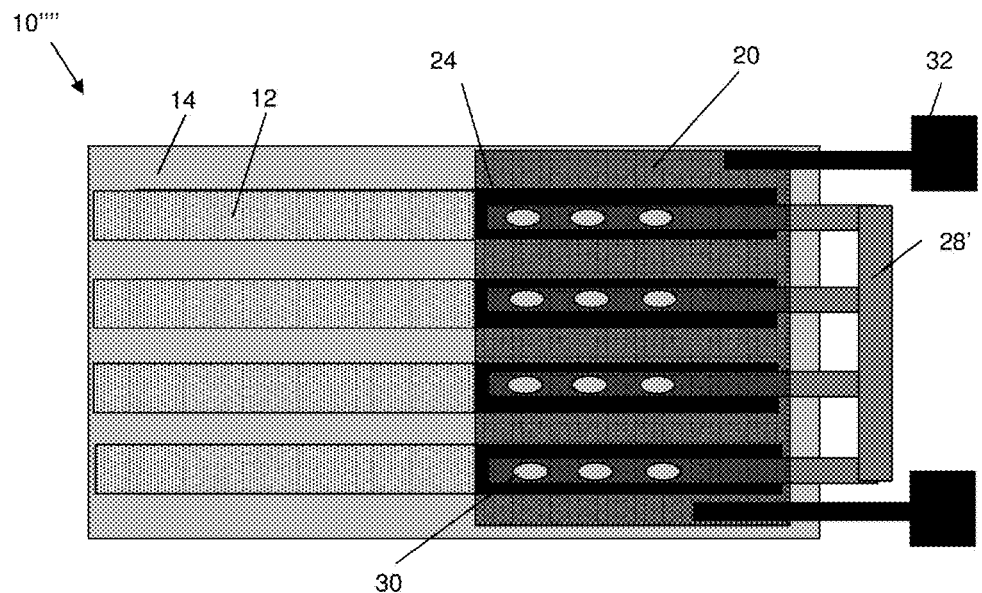
FIG. 5 shows an integrated graphene detector and waveguide structure and respective fabrication processes in accordance with additional aspects of the invention.

FIG. 5 shows an integrated graphene detector and waveguide structure and respective fabrication processes in accordance with additional aspects of the invention. In this embodiment, the integrated graphene detector and waveguide structure 10'''' can be a PIN detector, which includes a boron nitride material 24 (see, e.g., FIGS. 3A-3C) and/or insulator material 22 (see, e.g., FIGS. 2A-2C) between the graphene sheet 20 and the fin structures 12. In this and other embodiments described herein, it should be understood that the graphene sheet 20 can be a wraparound structure which extends over the entirety of the fin structures 12 and between the fin structures 12, on the surface of the buried oxide material 14.

As more specifically shown in FIG. 5, the integrated graphene detector and waveguide structure 10'''' includes a heavily doped N++ contact 32 (e.g., doped with phosphorous or arsenic) in direct electrical contact with the graphene sheet 20 on sides of the fin structures 12, and a heavily doped P++ top contact 28' (e.g., doped with boron) is in direct electrical contact with the graphene sheet 20 over the fin structures 12. In embodiments, the heavily doped P++ top contacts 28' are finger electrodes electrically connected to the graphene sheet 20 (which are parallel to the fin structures 12) using metal vias 30 formed in an interlevel dielectric material. It should also be understood by those of ordinary skill in the art that the contacts 32 can be P++ doped contacts and the top contacts 28' can be an N++ doped contacts. Moreover, in this and other implementations described herein, the contacts 32 can be source and drain contacts; whereas, the contacts 28' can be a top gate contact.

Figure 6:
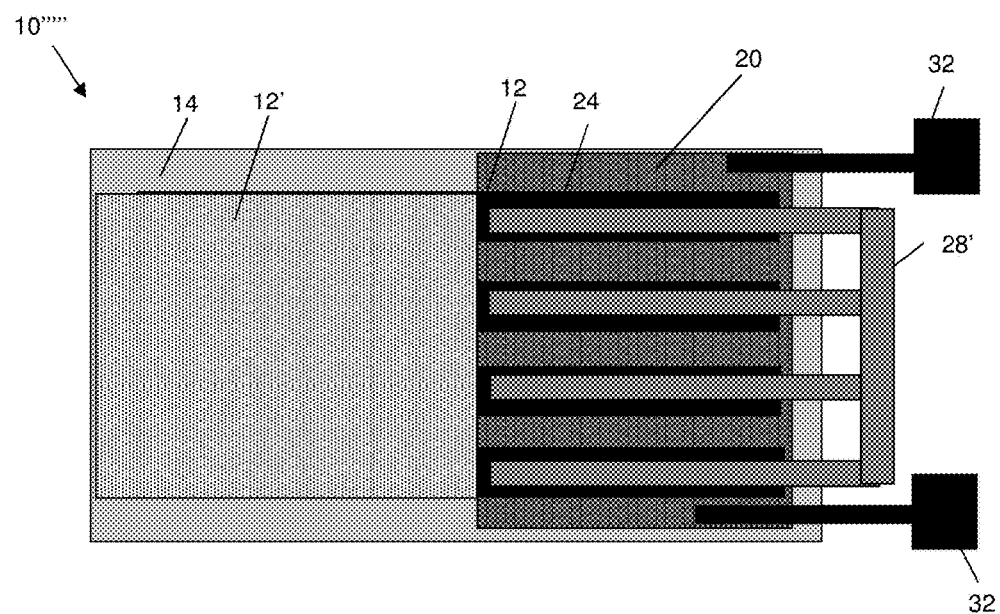
FIG. 6 shows an integrated graphene detector and waveguide structure and respective fabrication processes in accordance with additional aspects of the invention.

FIG. 6 shows an integrated graphene detector and waveguide structure and respective fabrication processes in accordance with additional aspects of the invention. In FIG. 6, the structure 10''''' includes a waveguide structure formed of a monolithic section of the substrate 12', e.g., a portion of the substrate that is not patterned to form the fin structures 12; whereas, the detector portion includes the fin structures 12. In addition, in this implementation, the contacts 32 can be source and drain contacts; whereas, the contacts 28' can be finger electrodes forming top gate contacts. The remaining features of the structure 10''''' are similar to that already described with respect to FIG. 5. And, as in the previously described embodiments, it should be understood by those of ordinary skill in the art that metal vias formed in an interlevel dielectric material can be used to make the electrical connections described herein.

Figure 7:
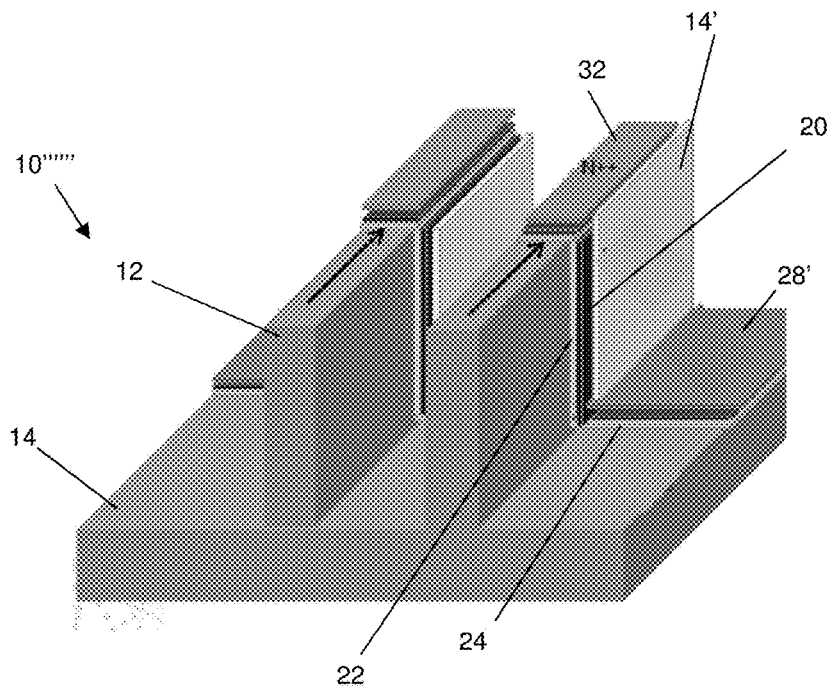
FIG. 7 shows an integrated graphene detector and waveguide structure and respective fabrication processes in accordance with additional aspects of the invention.

FIG. 7 shows an integrated graphene detector and waveguide structure and respective fabrication processes in accordance with additional aspects of the invention. In FIG. 6, the structure 10'''''' includes an insulator layer 14' selectively deposited on sidewalls of the fin structures 12 over the graphene sheet 20, which electrically insulates (e.g., electrically isolate) the contacts 28' from the contacts 32. Accordingly, the insulator layer 24' will prevent shorts from occurring between the contacts 28' and 32. Additionally, in this embodiment, for illustrative purposes the contacts 32 are heavily doped P++ contacts and the contacts 28' are heavily doped N++ contacts. The structure 10'''''' also includes boron nitride material 24 (see, e.g., FIGS. 3A-3C) and/or insulator material 22 (see, e.g., FIGS. 2A-2C) between the graphene sheet 20 and the fin structures 12.

Moreover, as in other embodiments described herein the graphene sheet 20 can be a wraparound structure which extends between the fin structures 12, on the surface of the buried oxide material 14. Moreover, as in the previously described embodiments, metal vias formed in an interlevel dielectric material can be used to make the electrical connections described herein.

Figure 8:
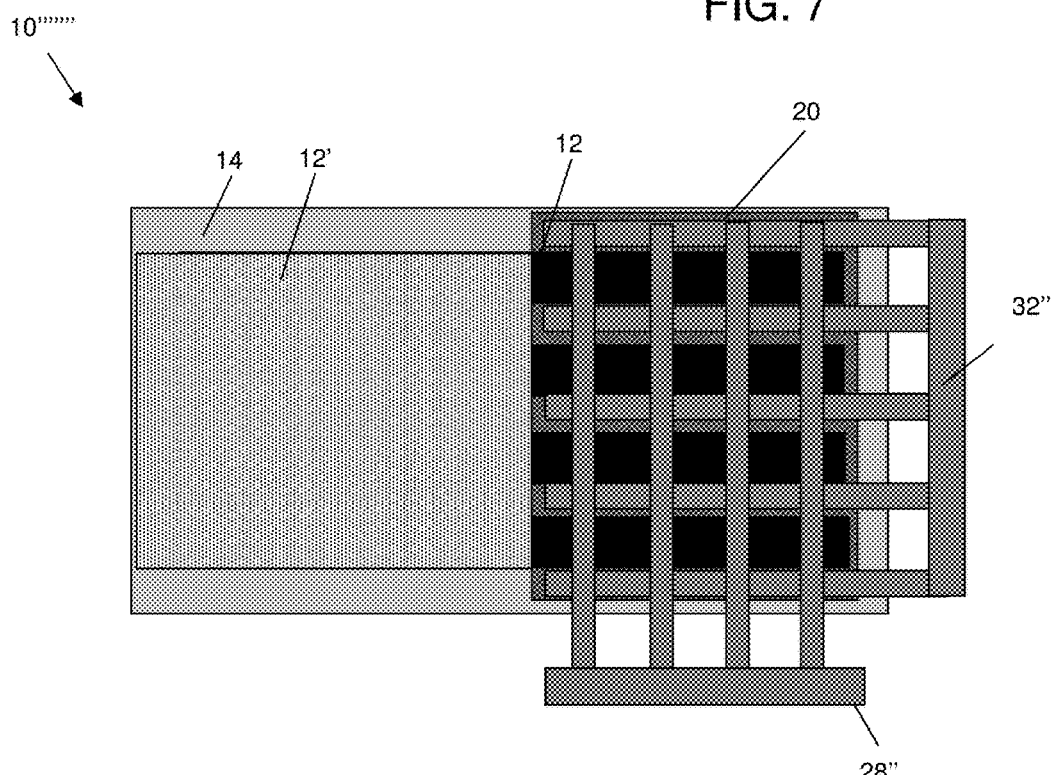
FIG. 8 shows an integrated graphene detector and waveguide structure and respective fabrication processes in accordance with additional aspects of the invention.

FIG. 8 shows a structure 10''''' comprising source and drain contacts 32'' (e.g., comprising finger electrodes) in electrical contact with the graphene sheet 20 between the fin structures 12. In this embodiment, accordingly, the graphene sheet 20 is a wraparound structure which extends entirely over and between the fin structures 12, on the surface of the buried oxide material 14. In addition, top contacts 28'' (e.g., comprising finger electrodes orthogonal to the fin structures) are provided over the fin structures 12. In embodiments, the top contacts 28'' can be gate contacts separated from the graphene sheets 20 by an insulator material, e.g., SiO$_2$. Also, in this embodiment, the waveguide structure is formed of a monolithic portion of the substrate 12', e.g., a portion of the substrate that is not patterned to form the fin structures 12; whereas, the detector portion includes the fin structures 12. As in the previously described embodiments, metal vias formed in an interlevel dielectric material can be used to make the electrical connections described herein.

Figure 9:
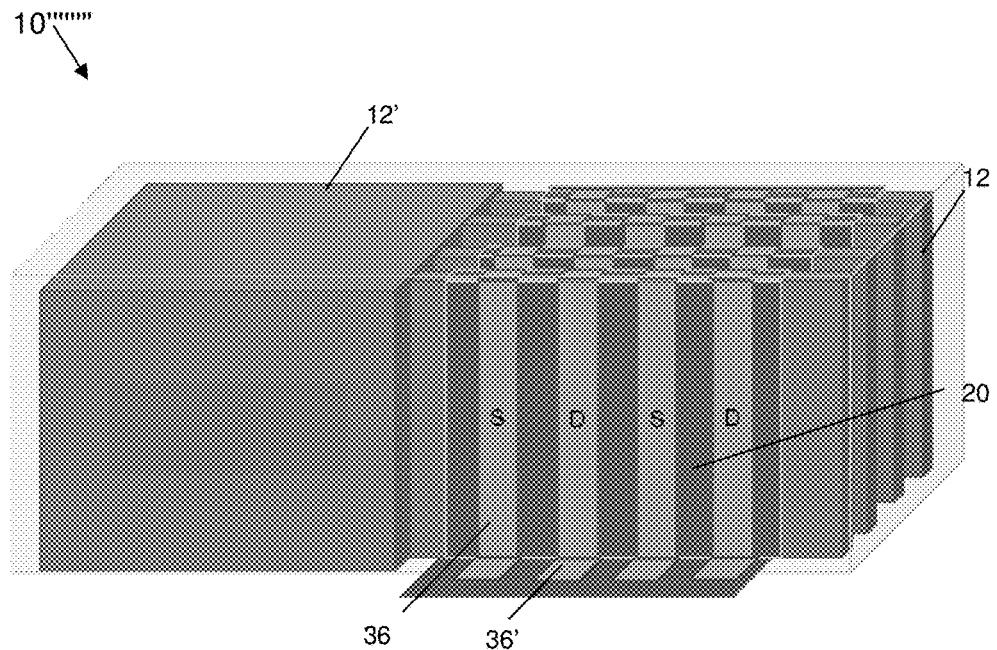
FIG. 9 shows an integrated graphene detector and waveguide structure and respective fabrication processes in accordance with additional aspects of the invention.

FIG. 9 shows a partial perspective view of an integrated graphene detector and waveguide structure 10'''''' (PIN detector) with repetitive fin structures 12 being a back gate comprising source contacts 36 and drain contacts 36' extending over and between the fin structures 12. Accordingly, in embodiments, the source contacts 36 and drain contacts 36' can be finger electrodes running orthogonal to the fin structures 12 (and hence extending between the fin structures over the insulator material 14). In this and other embodiments, the graphene sheet 20 is a wraparound structure which extends entirely over and between the fin structures 12, on the surface of the buried oxide material 14. Also, in this embodiment, the waveguide structure is formed of a monolithic portion of the substrate 12', e.g., a portion of the substrate that is not patterned to form the fin structures 12; whereas, the detector portion includes the fin structures 12. It is also contemplated, though, that the graphene sheets 20 can be provided only on the fin structures 12, as shown, e.g., in FIGS. 1C, 2C and 3C.

Figure 10:
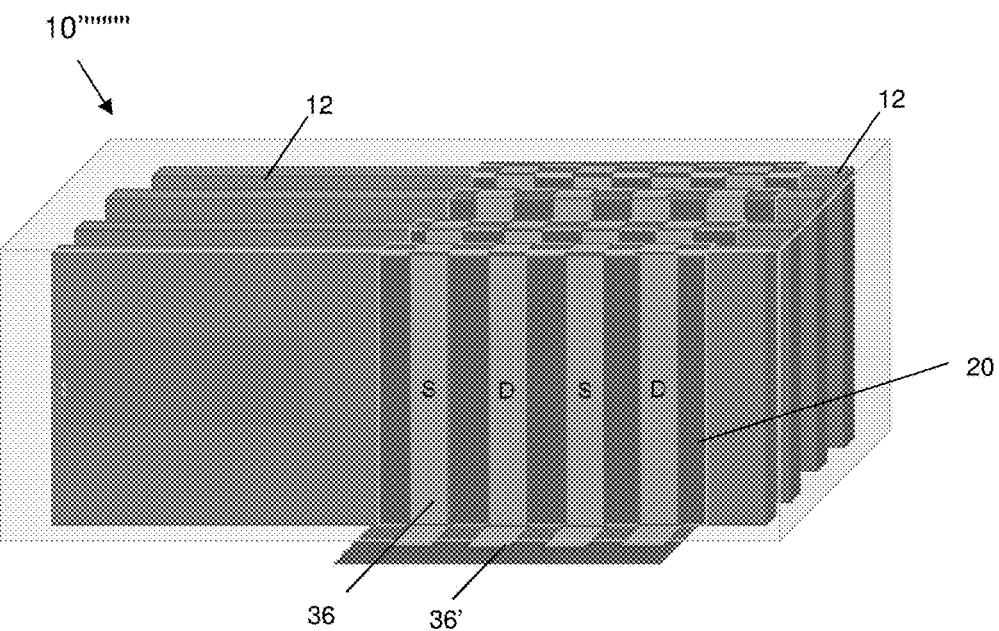
FIG. 10 shows an integrated graphene detector and waveguide structure and respective fabrication processes in accordance with additional aspects of the invention.

FIG. 10 shows a partial perspective view of an integrated graphene detector and waveguide structure 10''''''' (PIN detector) comprising source contacts 36 and drain contacts 36' extending over and between the fin structures 12. Again, in this embodiment, the source contacts 36 and drain contacts 36' can be finger electrodes running orthogonal to the fin structures 12 (and hence extending between the fin structures over the insulator material 14). In this and other embodiments, the graphene sheet 20 is a wraparound structure which extends entirely over and between the fin structures 12, on the surface of the buried oxide material 14. Also, in this embodiment, the waveguide structure is formed from the fin structures 12. It is also contemplated, though, that the graphene sheets 20 can be provided only on the fin structures 12, as shown, e.g., in FIGS. 1C, 2C and 3C.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a plurality of non-planar fin structures composed of substrate material;
   a non-planar sheet of graphene material which is a wraparound structure extending entirely over and filling an entire space between each of the plurality of non-planar fin structures;
   a plurality of gate contacts provided over the non-planar fin structures and separated from the non-planar sheet of graphene material by insulator material; and
   source and drain contacts in electrical contact with the non-planar sheet of graphene material between the non-planar fin structures.

2. The structure of claim 1, wherein the non-planar fin structures are silicon based waveguide structures.

3. The structure of claim 1, wherein the non-planer sheet of graphene material extends over the insulator material between the plurality of non-planar fin structures.

4. The structure of claim 1, wherein the non-planar sheet of graphene material is formed directly on the substrate material of the plurality of non-planar fin structures.

5. The structure of claim 1, wherein the non-planar sheet of graphene material is formed directly on the insulator material on the plurality of non-planar fin structures.

6. The structure of claim 1, wherein the non-planar sheet of graphene material is formed directly on a material that has a crystalline structure similar to graphene.

7. The structure of claim 1, wherein the non-planar sheet of graphene material is one to four sheets thick.

8. The structure of claim 1, further comprising contacts in electrical contact with the non-planar sheet of graphene material, above a top surface of the plurality of non-planar fin structures.

9. The structure of claim 8, wherein the contacts are finger contacts extending orthogonal to the he plurality of non-planar fin structures.

10. The structure of claim 8, wherein the plurality of non-planar fin structures and contacts form a PIN detector.

11. The structure of claim 10, wherein the PIN detector comprises a boron nitride material and the insulator material between the non-planar sheet of graphene material and the non-planar fin structures.

12. The structure of claim 1, wherein the insulator material comprises silicon dioxide.

13. The structure of claim 12, wherein the source and drain contacts comprise doped N++ contacts.

14. A structure, comprising:
a plurality of non-planar fin structures composed of substrate material;
a non-planar sheet of graphene material which is a wrap-around structure extending entirely over and filling an entire space between each of the plurality of non-planar fin structures;
a plurality of top contacts in direct electrical contact with the non-planar sheet of graphene material using metal vias; and
source and drain contacts in electrical contact with the non-planar sheet of graphene material between the non-planar fin structures.

15. The structure of claim 14, further comprising a waveguide structure which comprises a monolithic unpatterned portion of the substrate material.

* * * * *